US 6,746,825 B2

(12) United States Patent
Nealey et al.

(10) Patent No.: US 6,746,825 B2
(45) Date of Patent: Jun. 8, 2004

(54) GUIDED SELF-ASSEMBLY OF BLOCK COPOLYMER FILMS ON INTERFEROMETRICALLY NANOPATTERNED SUBSTRATES

(75) Inventors: Paul F. Nealey, Madison, WI (US); Juan J. DePablo, Madison, WI (US); Francesco Cerrina, Madison, WI (US); Harun H. Solak, Brugg (CH); XiaoMin Yang, Madison, WI (US); Richard D. Peters, Austin, TX (US); Qiang Wang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/971,442

(22) Filed: Oct. 5, 2001

(65) Prior Publication Data

US 2003/0091752 A1 May 15, 2003

(51) Int. Cl.[7] ................................. B05D 3/06
(52) U.S. Cl. .................. 430/315; 430/313; 430/330; 430/945; 427/558; 427/385.5; 369/100
(58) Field of Search .................. 430/315, 313, 430/330, 945; 427/558, 385.5; 369/100

(56) References Cited

U.S. PATENT DOCUMENTS 6,195,410 B1 * 2/2001 Cash, Jr. ....................... 378/43

OTHER PUBLICATIONS

T.A. Savas, et al., "Achromatic Interferometric Lithography for 100–nm–Period Gratings and Grids," J. Vac. Sci. Technol. B, vol. 13, No. 6, Nov./Dec., 1995, pp. 2732–2735.

T.A. Savas, et al., "Large–Area Achromatic Interferometric Lithography for 100 nm Period Gratings and Grids," J. Vac. Sci. Technol. B, vol. 14, No. 6, Nov./Dec., 1996, pp. 4167–4170.

P. Mansky, et al., "Ordered Diblock Copolymer Films on Random Copolymer Brushes," Macromolecules, vol. 30, 1997, pp. 6810–6813.

Xiaolan Chen, et al., "Interferometric Lithography of Sub–Micrometer Sparse Hole Arrays for Field–Emission Display Applications," J. Vac. Sci. Technol. B, vol. 14, No. 5, Sep./Oct., 1996, pp. 3339–3349.

Miri Park, et al., "Block Copolymer Lithography: Periodic Arrays of ~1011 Holes in 1 Square Centimeter," Science, vol. 276, No. 5317, May 30, 1997, pp. 1401–1404.

Hideaki Yokoyama, et al., "Structure and Diffusion of Asymmetric Diblock Copolymers in Thin Films: A Dynamic Secondary Ion Mass Spectrometry Study," Macromolecules, vol. 31, 1998, published on web Nov. 20, 1998, pp. 8826–8830.

(List continued on next page.)

Primary Examiner—Mark F. Huff
Assistant Examiner—Daborah Chacko-Davis
(74) Attorney, Agent, or Firm—Foley & Lardner

(57) ABSTRACT

Copolymer structures are formed by exposing a substrate with an imaging layer thereon to two or more beams of selected wavelengths to form interference patterns at the imaging layer to change the wettability of the imaging layer in accordance with the interference patterns. A layer of a selected block copolymer is deposited onto the exposed imaging layer and annealed to separate the components of the copolymer in accordance with the pattern of wettability and to replicate the pattern of the imaging layer in the copolymer layer. Stripes or isolated regions of the separated components may be formed with periodic dimensions in the range of 100 nm or less.

30 Claims, 9 Drawing Sheets

OTHER PUBLICATIONS

Wieland Schöllkopf, et al., "A Cluster Size Nanofilter with Variable Openings Between 2 and 50 nm," J. of Chemical Physics, vol. 109, No. 21, Dec. 1, 1998, pp. 9252–9257

J.A. Hoffnagle, et al., "Liquid Immersion Deep–Ultraviolet Interferometric Lithography," J. Vac. Sci. Technol. B, vol. 17, No. 6, Nov./Dec., 1999, pp. 3306–3309.

Christopher Harrison, et al., "Reducing Substrate Pinning of Block Copolymer Microdomains with a Buffer Layer of Polymer Brushes," Micromolecules, vol. 33, 2000, published on web Dec. 28, 1999, pp. 857–865.

Rob G.H. Lammertink, et al., "Nanostructured Thin Films of Organic–Organometallic Block Copolymers: One–Step Lithography with Poly(ferrocenylsilanes) by Reactive Ion Etching," Advanced Materials, vol. 12, No. 2, 2000, pp. 98–102.

Thomas Thurn–Albrecht, et al., "Nanoscopic Templates from Oriented Block Copolymer Films," Advanced Materials, vol. 12, No. 11, 2000, pp. 787–791.

Augustine Urbas, et al., "Tunable Block Copolymer/Homopolymer Photonic Crystals," Advanced Materials, vol. 12, No. 11, pp. 812–814.

Didier Benoit, et al., "One–Step Formation of Functionalized Block Copolymers," Macromolecules, vol. 33, 2000, published on web Feb. 12, 2000, pp. 1505–1507.

Richard D. Peters, et al., "Using Self–Assembled Monolayers Exposed to X–Rays to Control the Wetting Behavior of Thin Films on Diblock Copolymers," Langmuir, vol. 16, 2000, published on web Apr. 7, 2000, pp. 4625–4631.

V.Y. Banine, et al., "Comparison of Extreme Ultraviolet Sources for Lithography Applications," Micoelectronic Engineering, vol. 53, 2000, pp. 681–684.

Qiang Wang, et al., "Symmetric Diblock Copolymer Thin Films Confined Between Homogeneous and Patterned Surfaces: Simulations and Theory," J. of Chemical Physics, vol. 112, No. 22, Jun. 8, 2000, pp. 9996–10010.

Jakob Heier, et al., "Kinetics of Individual Block Copolymer Island Formation and Disappearance Near an Absorbing Boundary," Macromolecules, vol. 33, 2000, published on web Jul. 7, 2000, pp. 6060–6067.

Yachin Cohen, et al., "Deformation of Oriented Lamellar Block Copolymer Films," Macromolecules, vol. 33, 2000, published on web Aug. 5, 2000, pp. 6502–6516.

M. Switkes, et al., "Patterning of Sub–50 nm Dense Features with Space–Invariant 157 nm Interference Lithography," Applied Physics Letters, vol. 77, No. 20, Nov. 13, 2000, pp. 3149–3151.

Tae K. Kim, et al., "Chemical Modification of Self–Assembled Monolayers by Exposure to Soft X–Rays in Air," J. Phys. Chem. B, vol. 104, 2000, published on web, Jul. 18, 2000, pp. 7403–7410.

Richard D. Peters, et al., "Combining Advanced Lithographic Techniques and Self–Assembly of Thin Films of Diblock Copolymers to Produce Templates for Nanofabrication," J. Vac. Sci. Technol. B, vol. 18, No. 6, Nov./Dec., 2000, pp. 1–5.

T. Thurn–Albrecht, et al., "Ultrahigh–Density Nanowire Arrays Grown in Self–Assembled Diblock Copolymer Templates," Science, vol. 290, No. 5499, Dec. 15, 2000, pp. 2126–2129.

Xiao M. Yang, et al., "Guided Self–Assembly of Symmetric Diblock Copolymer Films on Chemically Nanopatterned Substrates," Macromolecules, vol. 33, 2000, published on web Dec. 26, 2000, pp. 9575–9582.

Alexander C. Edrington, et al., "Polymer–Based Photonic Crystals," Advanced Materials, vol. 13, No. 6, Mar. 16, 2001, pp. 421–425.

C.T. Black, et al., "Integration of Self–Assembled Diblock Copolymers for Semiconductor Capacitor Fabrication," Applied Physics Letters, vol. 79, No. 3, Jul. 16, 2001, pp. 409–411.

A. Yen, et al., "Achromatic Holographic Configuration for 100–nm–Period Lithography," Applied Optics, vol. 31, No. 22, Aug. 1, 1992, pp. 4540–4545.

H.H. Solak, et al., "Exposure of 38 nm Period Gratings Patterns with Extreme Ultraviolet Interferometric Lithography," Applies Physics Letters, vol. 75, 1999, pp. 2328–2330.

Yang, X. M. et al., "Patterning of self–assembled monolayers with lateral dimensions of 0.15 $\mu$m using advanced lithography," J. Vac. Sci. Technol. B, 17(6), Nov/Dec 1999, pp. 3203–3207; published by American Vacuum Society.

Peters, R.D. et al., "Combining advanced lithographic techniques and self–assembly of thin films of diblock copolymers to produce templates for nanofabrication," J. Vac. Sci. Technol. B, 18(6), Nov/Dec 2000, pp. 3530–3534; published by American Vacuum Society.

Yang, X. M. et al., "Proximity X–ray Lithography Using Self–Assembled Alkylsiloxane Films: Resolution and Pattern Transfer," Langmuir, 2001, 17, pp. 228–233; published by American Chemical Society.

Wang, Q. et al., "Monte Carlo simulations of diblock copolymer thin films confined between two homogeneous surfaces," Journal of Chemical Physics, 112(1), Jan. 1, 2000; published by American Institute of Physics.

Wang, Q. et al., "Monte Carlo Simulations of Diblock Copolymer Thin Films Confined between Chemically Heterogeneous Hard Surfaces," Macromolecules, 2000, 33, pp. 4512–4525; published by American Chemical Society.

Wang, Q. et al., "Monte Carlo Simulations of Asymmetric Diblock Copolymer Thin Films Confined between Two Homogeneous Surfaces," Macromolecules, 2001, 34, pp. 3458–3470; published by American Chemical Society.

Nath, S. K. et al., "Density functional theory of molecular structure for thin diblock copolymer films on chemically heterogeneous surfaces," Journal of Chemical Physics, 110(15), Apr. 15, 1999; published by American Institute of Physics.

Solak, H. H. et al., "EUV Inteferometric Lithography for Resist Characterization," SPIE, vol. 3676, Santa Clara, California, Mar. 1999.

* cited by examiner

Interfacial energy between SAMs of OTS exposed at different doses and polystyrene (●) and poly(methyl methacrylate)(▼). Approximate experimentally determined regimes of wetting behavior of PS and PMMA also are indicated on the plot.

GUIDED SELF-ASSEMBLY OF BLOCK COPOLYMER FILMS ON INTERFEROMETRICALLY NANOPATTERNED SUBSTRATES

This invention was made with United States government support awarded by the following agency: NSF Grant No: 9708944. The United States has certain rights in this invention.

FIELD OF THE INVENTION

This invention pertains generally to the field of nanofabrication techniques and particularly to nanofabrication carried out utilizing diblock copolymers.

BACKGROUND OF THE INVENTION

Significant challenges are encountered in the fabrication of nanostructures, particularly structures at a length scale of 10 nm to 50 nm. It is possible to fabricate isolated or semi-dense structures at this scale with an advanced lithographic technique such as electron beam lithography, but the exposure tools are extremely expensive and optimization of photo-resist processing is non-trivial and may not be amenable to strict control of dimensions or roughness.

New processes and novel materials are required to make nanofabrication easier, cheaper, and more versatile. Block copolymers are interesting materials for use in nanofabrication because they microphase separate to form ordered, chemically distinct domains with dimensions of 10's of nm. The size and shape of these domains can be controlled by manipulating the molecular weight and composition of the copolymer. Additionally, the interfaces between these domains have widths on the order of 1–5 nm and can be controlled by changing the chemical composition of the blocks of the copolymers. An advantage of using block copolymer systems as templates is that linewidth, tolerances and margins, and line edge roughness are dictated by thermodynamics (molecular weight, the Flory-Huggins interaction parameters $\chi$ between the blocks of the copolymer). It is unclear whether standard resist processing, where performance depends on control of kinetic processes, will be applicable at the scale of 10's of nm.

The feasibility of using thin films of block copolymers as templates was demonstrated previously by Chaikin and Register, et al., Science 276, 1401 (1997). Dense arrays of dots and holes with dimensions of 20 nm were transferred from a thin film of poly(styrene-b-isoprene) to silicon nitride substrates. The perfection of ordering of domains extend over grain sizes of approximately 1 $\mu m^2$. For many applications, macroscopic orientation of the copolymer domains over areas as large as several $cm^2$ and registration of the domains with the substrate will be required. Thin films with macroscopically ordered domains are envisioned as having potential in several applications including nanowires, magnetic storage media, quantum devices, and photonic crystals. Strategies for inducing macroscopic orientation of copolymer domains in thin films have included: (1) the use of electric fields to orient cylindrical domains in asymmetric diblock copolymer films both parallel to the film along electric field lines and perpendicular to the film in hexagonal arrays, (2) the use of miscut silicon wafers as substrates to align thickness induced morphologies along the corrugations of the substrate, (3) the use of miscut silicon wafers with obliquely deposited Au stripes to promote alternating wetting of the blocks on the alternating Si and Au stripes and perpendicular orientation of lamellar domains, and (4) the use of sidewall constraints to induce long range ordering of spherical domains in asymmetric diblock copolymers.

One approach to inducing macroscopic orientation of the domains of block copolymers combines advanced lithographic techniques and the self-assembly of the block copolymer film. Organic imaging layers are patterned using lithographic tools, e.g., proximity x-ray lithography with a mask and extreme ultraviolet (EUV) interferometric lithography. Regions of the imaging layer that are exposed to radiation or electrons undergo a chemical transformation that alters the surface chemistry of the imaging layer. A thin film of a symmetric diblock copolymer is then deposited on the patterned imaging layer and annealed above the glass transition temperature of the blocks of the copolymer. During annealing, the lamellar domains of the copolymer film self-assemble such that adjacent regions of the chemically patterned surface are wet by the different blocks of the copolymer. The lamellae orient perpendicular to the plane of the film and amplify the surface pattern. After annealing, selective removal of one of the blocks results in a nanopatterned template that can be used for additive or subtractive processes for nanofabrication. This strategy has the advantages of achieving macroscopic orientation of the lamellar domains using parallel exposure tools and registration of the patterned film with the substrate. See, Richard D. Peters, et al., "Using Self-Assembled Monolayers Exposed to X-Rays to Control the Wetting Behavior of Thin Films of Diblock Copolymers," Langmuir, Vol. 16, 2000 (published on web Apr. 7, 2000), pp. 4625–4631; Qiang Wang, et al., "Symmetric Diblock Copolymer Thin Films Confined Between Homogenous and Patterned Surfaces: Simulations and Theory," Journal of Chemical Physics, Vol. 112, No. 22, Jun. 8, 2000, pp. 9996–10010; Tae K. Kim, et al., "Chemical Modification of Self-Assembled Monolayers by Exposure to Soft X-Ray in Air," J. Phys. Chem. B., Vol. 104, 2000 (published on web Jul. 18, 2000), pp. 7403–7410.

SUMMARY OF THE INVENTION

In the present invention, advanced interferometric lithography is combined with self-assembled block copolymer systems to provide nanofabricated structures. Interferometry is used to pattern substrates with regions of different chemical functionality in spatial arrangements commensurate with the characteristic dimensions of the domain structure of the polymer. Upon ordering, the morphology of a block copolymer layer on the surface of the substrate is guided toward the desired long-range orientation, amplifying the pattern on the surface. The block copolymers can be synthesized for guided self-assembly and either are functional as formed or can be functionalized after microstructures are formed.

In forming the copolymer microstructures in accordance with the invention, a substrate is provided with an imaging layer thereon that will respond to exposure to selected wavelengths to change the wettability of the exposed material of the imaging layer to the components of a selected block copolymer. The imaging layer is then exposed to two or more beams of radiation within the selected wavelengths to form interference patterns at the imaging layer to change the wettability of the imaging layer in accordance with the interference patterns. Preferably, the interference pattern in the imaging layer has a period substantially equal to, and preferably within 20% of, the bulk lamellar period $L_0$ of the selected copolymer. For interference patterns having periods in the range of 10–100 nm, the exposing radiation preferably is at selected wavelengths in the extreme ultraviolet or shorter. A layer of the selected copolymer is then deposited onto the exposed imaging layer, and the copolymer layer is annealed to separate the components of the copolymer in accordance with the pattern of wettability in the underlying imaging layer to replicate the pattern of the imaging layer in the copolymer layer. For example, one of the beams may be provided directly from the source onto the imaging layer and the other beam may be provided by reflecting a portion of the beam from the same source with a Lloyd's mirror onto the imaging layer at an angle to the beam that is directly incident on the imaging layer. Where two such beams are utilized, the resulting pattern in the imaging layer defined by the interference pattern is a periodic pattern of alternating stripes which differ in wettability with respect to one of the components of the copolymer. The resulting microstructure in the annealed copolymer layer can comprise corresponding alternating stripes of the two components of the copolymer that are separated in accordance with the regions of greater or lesser wettability. Other interferometric processes and instruments may also be utilized.

A third beam may be provided to the imaging layer by reflecting a portion of the beam from the same source with another Lloyd's mirror onto the imaging layer at an angle to the beam that is directly incident on the imaging layer. The two Lloyd's mirrors are positioned at an angle to each other to provide interference patterns at the imaging layer that are at an angle to each other. In this manner, an array of separated regions can be defined in the imaging layer in which the separated regions have a higher or lower wettability with respect to one of the components of the copolymer. Deposit of the copolymer layer and annealing of the copolymer layer results in regions of one of the components of the copolymer separated primarily by components of the other copolymer in a pattern which corresponds to the underlying pattern in the imaging layer. The imaging layer may be formed of materials such as self-assembled monolayers such as alkylsiloxanes. Various block copolymers may be utilized, one example of which is a copolymer of polystyrene and poly(methyl methacrylate).

Further objects, features and advantages of the invention will be apparent from the following detailed description when taken in conjunction with the accompanying drawings.

DETAILED DESCRIPTION OF THE INVENTION

In the present invention, thin films of block copolymer are self-assembled to produce structures that may be used, e.g., as templates for nanofabrication under appropriately controlled conditions. Processing conditions are preferably utilized that induce perpendicular orientation of the microphase separated domains and amplification of the surface patterns that are lithographically formed on a substrate. The following discusses the factors that influence the preferred processing conditions.

Figure 1:
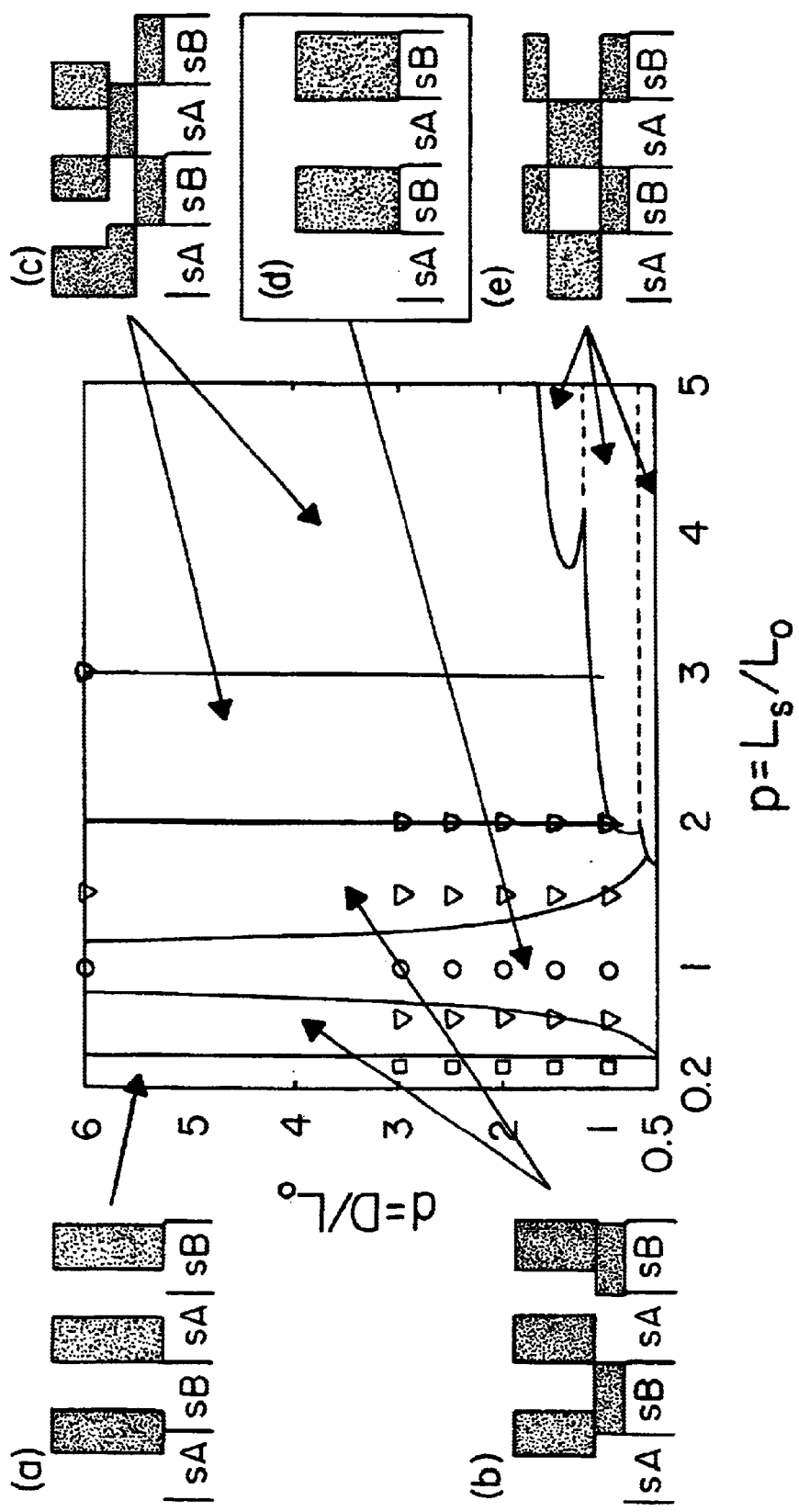
FIG. 1 is a phase diagram of equilibrium film morphologies for symmetric diblock copolymer films confined between patterned and neutral surfaces.

The free energy of symmetric diblock copolymer films confined between homogeneous and patterned surfaces is assumed to consist of four contributions: (1) the elastic free energy associated with chain stretching, (2) the block—block interfacial energy, (3) the surface-block interfacial energy, and (4) the free energy of bending if the lamellae were not flat. The equilibrium film morphology was determined from proposed structures with the minimum total free energy, and is found to be primarily a result of the competition between unfavorable surface-block interactions and chain stretching. Monte Carlo simulations were used that generated all possible structures, and the results allowed the construction of a phase diagram, as shown in FIG. 1, of equilibrium film morphologies as a function of the film thickness, the period of the pattern on the substrate, the bulk lamellae period $L_0$ of the polymer, and the interaction potentials of the individual blocks of the polymer with the bounding surfaces. This figure shows a phase diagram of equilibrium film morphologies for symmetric diblock copolymer films confined between patterned and neutral surfaces. The abscissa is the ratio of pattern period to lamellar period, and the ordinate is the ratio of film thickness to lamellar period. Symbols represent Monte Carlo results, and lines represent results from calculations from the phenomenological model. Schematics (a) through (e) are representations of the film morphology in each region of the phase diagram, where light regions represent one block and dark regions represent the other block. The surface pattern is designated by alternating sA and sB regions. Schematic (d) represents the desired film morphology with perpendicular orientation of lamellae that amplify the surface pattern. The optimal conditions that resulted in perpendicular lamellae that amplified the surface were found to be (1) the period of the substrate pattern equaled the bulk period of the lamellar domains ($L_0$), (2) the upper surface of the film was near neutral wetting conditions (had equal affinity for both blocks of the copolymer), and (3) the film thickness was equal to or less than Lo. Slight deviations from these optimal conditions, e.g., the upper surface had a slight affinity for one of the blocks or the film thickness was greater than Lo, still resulted in the desired behavior.

Imaging layers were developed to meet the following criteria: (1) the surface chemistry must be tunable by interferometric techniques such that exposed and unexposed regions have different affinities (wetting) for the blocks of the copolymer, and (2) the layers must be thermally stable during a high temperature annealing of the polymer films. Self assembled monolayers (SAMs) of alkylsiloxanes are suitable as imaging layers because: (1) the surface chemistry of SAMs of alkylsiloxanes on $SiO_x$ can be modified by suitable exposure (e.g., to x-rays in the presence of air), (2) SAMs are ultrathin layers (2.6 nm) (eliminating opacity issues for extreme ultraviolet (EUV) lithography), and (3) SAMs of alkylsiloxanes are thermally stable under vacuum up to temperatures of 740 K. Chemical modification of a $CH_3$-terminated SAM of octadecyltrichlorosilane (OTS) occurs and photoelectrons are emitted from the substrate upon irradiation with, e.g., x-rays. These photoelectrons produce radicals at the surface of the SAM. The surface radicals react with oxygen in the exposure atmosphere to produce hydroperoxy radicals or undergo recombination or crosslinking reactions. The hydroperoxy radicals decompose to form hydroxyl, aldehyde, and carboxylic acid groups on the surface of the SAM. The selectivity of the reaction for production of hydroperoxy radicals versus recombination/crosslinking reactions depends upon the pressure of oxygen in the exposure atmosphere, and this competition between reactions results in asymptotic conversion of the $CH_3$ groups to polar, oxygen containing groups, with the asymptotic limit also being a function of the pressure of oxygen.

Figure 2:
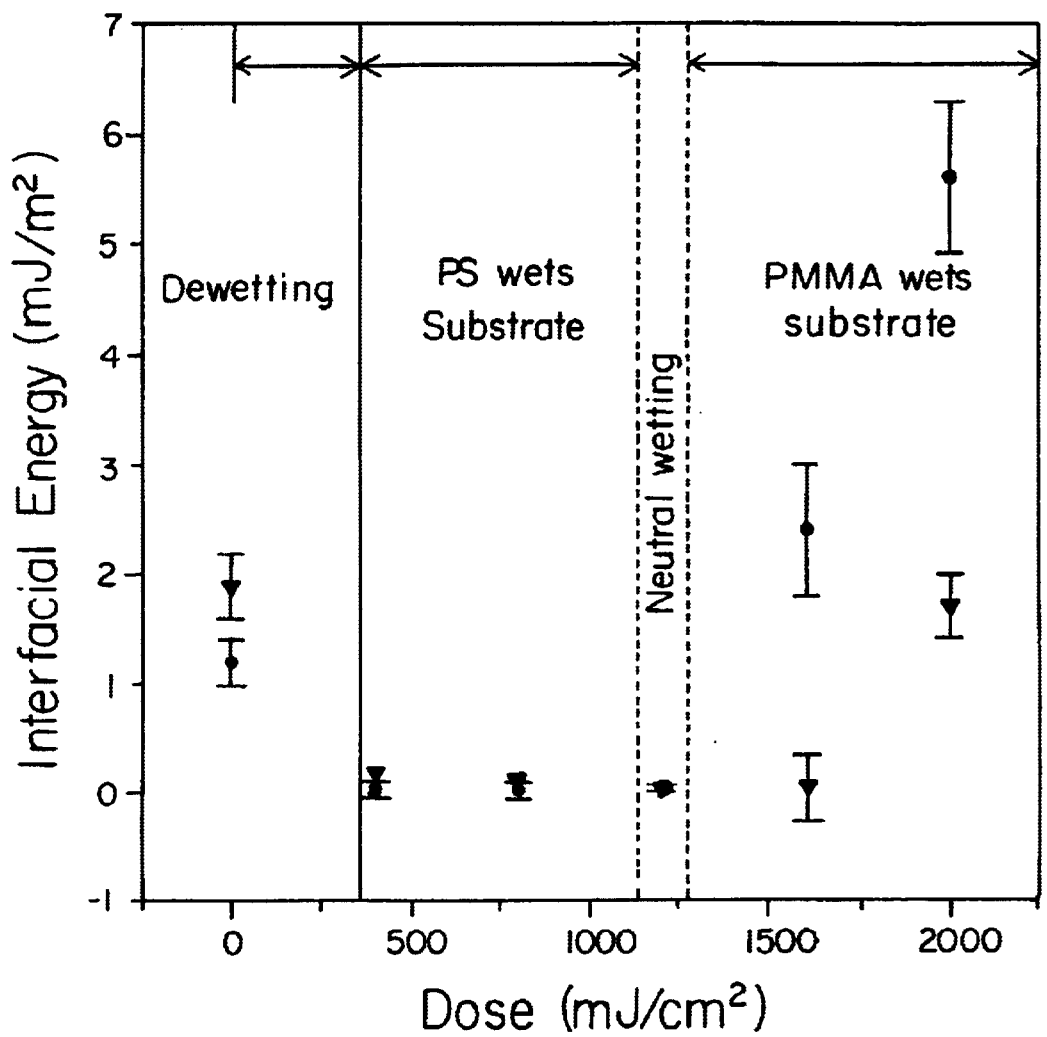
FIG. 2 is a diagram of interfacial energy between self-assembled monolayers of OTS exposed at different doses and a copolymer of polystyrene and poly(methyl methacrylate).

The wetting behavior of block copolymer thin films has been shown to depend upon the interfacial energy between each block of the copolymer and the substrate, with the block having the lower interfacial energy preferentially wetting the substrate. The interfacial energies ($\gamma$) between polystyrene (PS) and poly(methyl methacrylate) (PMMA) and SAMs of OTS exposed to x-rays in air was calculated as a function of dose as shown in FIG. 2, and the wetting behavior of thin films of poly(styrene-b-methyl methacrylate) (P(S-b-MMA)) was described qualitatively at each dose. Unexposed SAMs of OTS were dewet by films of P(S-b-MMA) because the spreading coefficient was less than 0. The polymer films wet SAMs of OTS with the PS block present at the substrate interface for exposure doses between 300 and 1000 $mJ/cm^2$ because $\gamma PS/OTS$ was lower than $\gamma PMMA/OTS$. At a dose of 1200 $mJ/cm^2$, $\gamma PS/OTS = \gamma PMMA/OTS = 0$, and the surfaces were neutral such that the lamellae oriented perpendicular to the substrate. For doses greater than 1400 $mJ/cm^2$, $\gamma PMMA/OTS < \gamma PS/OTS$, and the PMMA block preferentially wet the substrate. SAMs of alkylsiloxanes were concluded to be suitable imaging layers: (1) SAMs of OTS exposed to low doses of x-rays in air (between 300 and 500 $mJ/cm^2$) are wet by the PS block of P(S-b-MMA) films, (2) SAMs of OTS exposed to high doses of x-rays in air (greater than 1400 $mJ/cm^2$) are converted to polar surfaces that are preferentially wet by the PMMA block of P(S-b-MMA) films. Therefore, SAMs of OTS meet the criterion that exposed and unexposed (or lightly exposed) regions are wet by the different blocks of the copolymer.

The requirements for the exposure system under preferred conditions are: (1) capability to pattern at the scale of $L_0$ (10–100 nm), and (2) ability to pattern over large areas in a parallel process. EUV, proximity x-rays, and electron beam lithography are capable of patterning at the scale of $L_0$, but only EUV and proximity x-ray lithography are parallel techniques. Proximity x-ray lithography is limited by the difficulty of fabricating masks with dense features with periods at the scale of $L_0$. EUV lithography is advantageous compared to x-ray lithography because the mean free path of the photoelectrons produced by photons absorbed in the substrate is minimized for EUV radiation (e.g., $\lambda=13.4$ nm). The imaging layer undergoes chemical transformation as a result of the photoelectrons emitted from the substrate during irradiation. This minimum in the photoelectron energy reduces the lateral spreading of the photoelectrons and results in higher fidelity in pattern transfer to the imaging layer. Information regarding the chemical modification of SAMs of OTS with EUV radiation is not known to the same detail as for x-rays, but exposure of SAMs of OTS to high doses of EUV radiation in air results in similar changes in surface properties such that these surfaces are wet by the PMMA block of P(S-b-MMA) films.

The present invention carries out lithography to pattern at the scale of $L_0$ utilizing interferometric techniques. An exemplary lithography system in accordance with the present invention is an EUV lithographic system utilizing a Lloyd's mirror interferometer to produce high density fringes. Part of the incident beam is reflected from the Lloyd's mirror at a grazing angle and interferes with the direct beam at the plane of the substrate. Such a system is capable of producing grating patterns with very small periods, on the order of 10's of nm. Suitable EUV radiation can be obtained from various sources, including synchrotrons. For a general comparison of presently available EUV sources, see V. Y. Banine, et al., "Comparison of Extreme Ultraviolet Sources for Lithography Applications," Microelectronic Engineering, Vol. 53, 2000, pp. 681–684. Although the present invention is exemplified below utilizing EUV interferometric lithography, it is understood that suitable nano-dimensioned interference patterns may be formed utilizing radiation at longer wavelengths. The following papers discuss examples of techniques that may be utilized to form nano-interference patterns: T. A. Savas, et al., "Achromatic Interferometric Lithography for 100-nm-Period Gratings," J. Vac. Sci. Technol. B., Vol. 13, No. 6, November/December, 1995, pp. 2732–2735; Xiaolen Chen, et al., "Interferometric Lithography of Sub-Micrometer Sparse Hole Arrays for Field-Emission Display Applications," J. Vac. Sci. Technol. B., Vol. 14, No. 5, September/October, 1996, pp. 3339–3349; T. A. Savas, et al., "Large-Area Achromatic Interferometric Lithography for 100 nm Period Gratings and Grids," J. Vac. Sci. Technol. B, Vol. 14, No. 6, November/December, 1996, pp. 4167–4170; Wieland Schollkopf, et al., "A Cluster Size Nanofilter with Variable Openings Between 2 and 50 nm," J. of Chemical Physics, Vol. 109, No. 21, 1 December 1998, pp. 9252–9257; J. A. Hoffnagle, et al., "Liquid Immersion Deep Ultraviolet Interferometric Lithography," J. Vac. Sci. Technol. B, Vol. 17, No. 6, November/December, 1999, pp. 3306–3309; M. Switkes, et al., "Patterning of Sub-50 nm Dense Features with Space-Invariant 157 nm Interference Lithography," Applied Physics Letters, Vol. 77, No. 20, Nov. 13, 2000, pp. 3149–3151.

The wetting behavior and morphology of thin films of P(S-b-MMA) on surfaces nanopatterned using EUV interferometric lithography were studied as a function of the commensurability between pattern period and lamellar period. For example, a film of P(S-b-MMA) was deposited on a surface patterned with a period of $L_0$ ($L_0=60$ nm) using EUV interferometric lithography. The film thickness was about equal to $L_0$. TEM images were obtained with staining of the PS block with $RuO_4$, so that the PS block appears darker than the PMMA block, and confirm a perpendicular orientation of lamellae, with the lamellae amplifying the surface pattern. The lamellae were ordered over distances of several micrometers. The experimental conditions were very similar to the optimal conditions determined by simulations: (1) the pattern period substantially equaled $L_0$, and (2) the film thickness was $\leq L_0$. The condition of neutral upper surface varied slightly in that the free surface of the film was slightly preferential to the PS block. In addition, the upper surface was a free surface compared to a confined surface in the simulations.

It is understood that many other block copolymers may be utilized. By way of example only, these include poly(styrene-b-isoprene), poly(styrene-b-butadiene), and poly(styrene-b-vinylpyridine).

Figure 3:
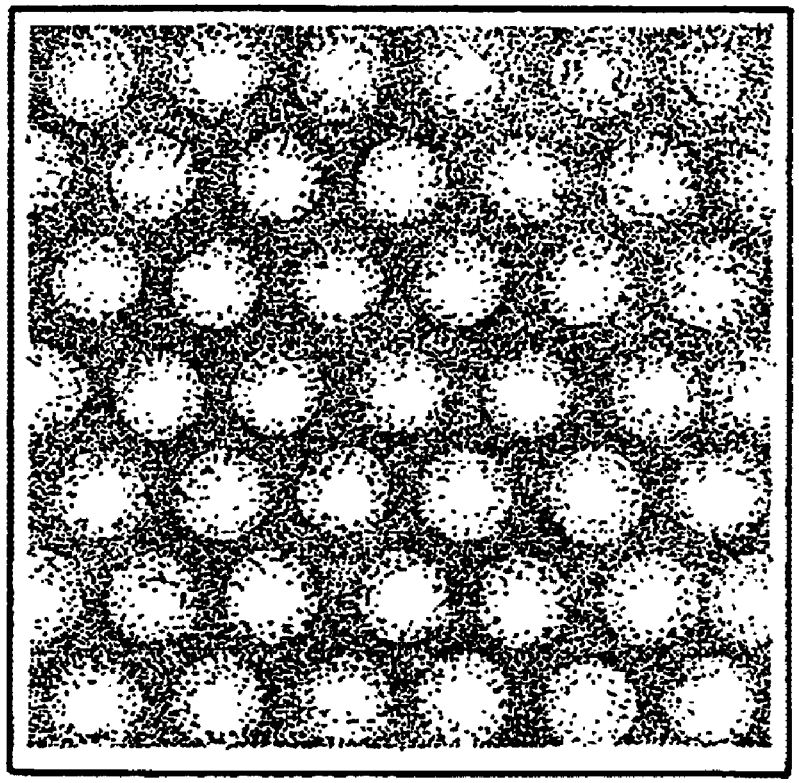
FIG. 3 is an illustrative diagram of calculated extreme ultraviolet intensity at a sample surface utilizing multiple interfering beams.
Figure 4:
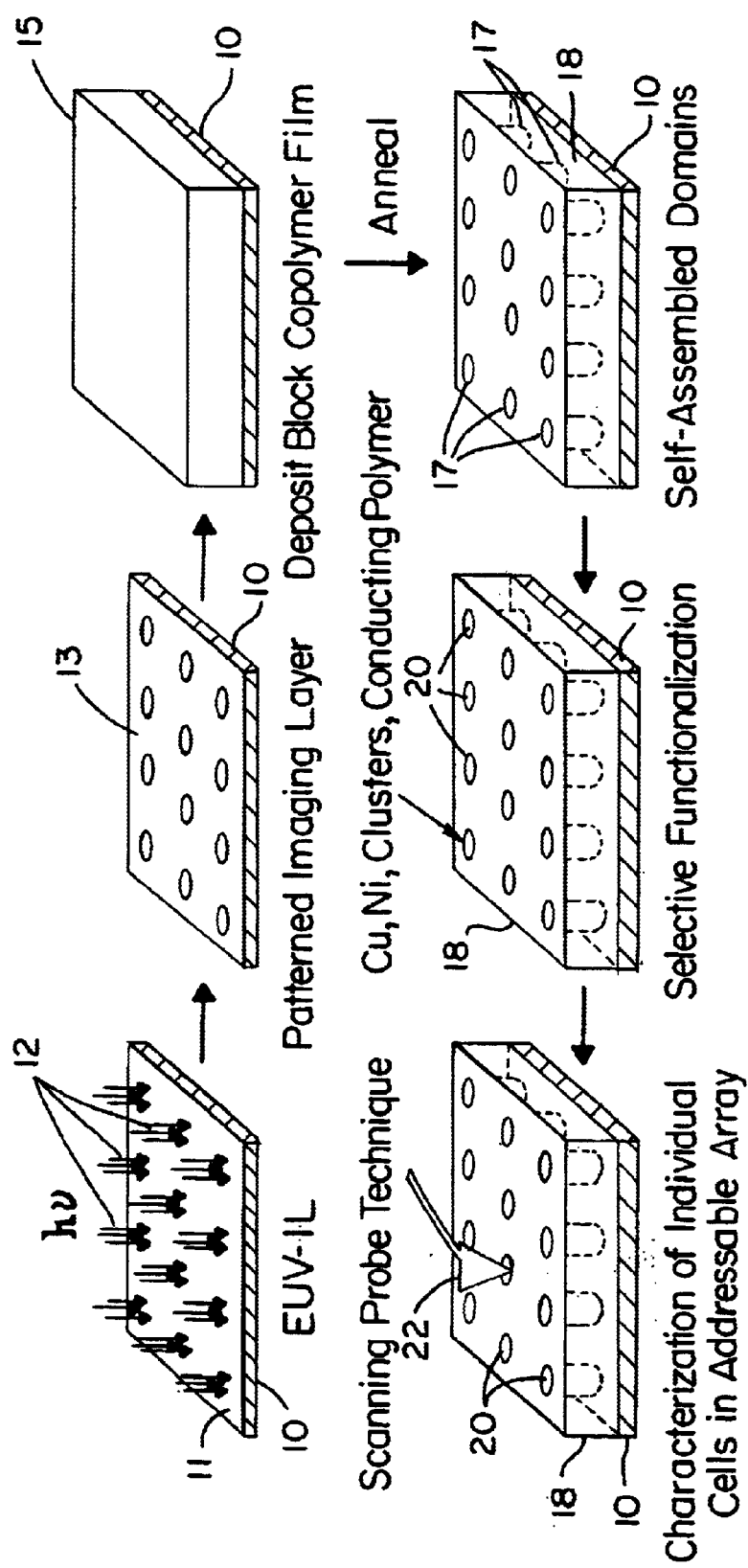
FIG. 4 is a simplified diagram illustrating the steps in forming of copolymer structures in accordance with the invention.

As discussed above, interferometric patterning is well suited for preparing substrates to guide the self-assembly of lamellar and cylindrical morphologies because the interference patterns and the block copolymer morphologies exhibit the same symmetry. In accordance with the invention, crossing two coherent beams of light or using an interferometer such as a Lloyd's mirror interferometer results in alternating constructive and destructive interference "stripes" to guide the self-assembly of lamellar domains. Double exposure of stripes with an included angle of 120°, or intersecting three equally spaced beams of light, results in patterns with six-fold symmetry, or spots of constructive interference in a hexagonal array, which are utilized for guiding the self-assembly of cylindrical domains. For example, two Lloyd's mirrors can be mounted with an included angle between them of 120°. The EUV beam illuminates the edge region, thus being reflected by both mirrors. This defines three sources (two virtual and one real, the direct beam). The superposition of the tri-fold symmetric fields creates a triangular exposure pattern of sharp "dots" at the substrate lane, mounted perpendicularly to the symmetry axis of the system. The Lloyd's mirror system design is very tolerant of alignment. The lattice constant of the three-fold pattern can be easily changed by adjusting the incidence angle of the incoming beam. It is also important to notice that where the maxima of the fringes overlap, a bright spot is formed with an intensity equal to nine times that of the incoming beam. The type of pattern obtained is shown in FIG. 3. The interferometer preferably is integrated in a small volume, in order to increase stiffness and minimize vibrations. Piezoelectric actuators may be used to align and maintain the alignment of the mirrors. A similar arrangement can be implement with two mirrors at 90°, yielding a rectangular pattern. The process is carried out as illustrated in FIG. 4. A substrate 10 has an imaging layer 11 formed thereon that is patterned with EUV as described above. The resulting patterned imaging layer 13 is then covered with a layer of a selected block copolymer 15, and the copolymer layer is then annealed to form an array of self assembled separated domains 17 of one polymer that are surrounded by the other polymer 18. Selective functionalization of the patterned structure may then be carried out, e.g., by etching out or otherwise removing the polymer in the domains 17 and filling the openings with another material, for example, a metal such as copper or nickel or a conducting polymer to form cells 20. The individual cells 20 formed in this manner may be characterized in various ways, such as by the use of a scanning probe 22 as shown in FIG. 4.

Figure 5:
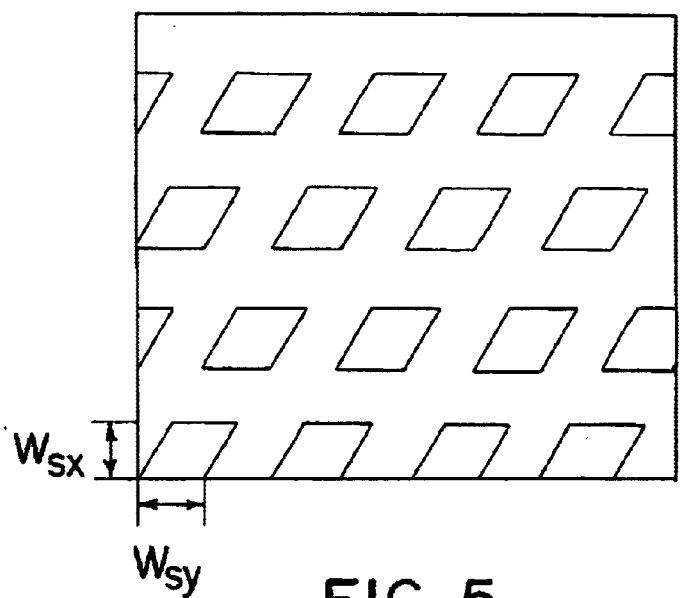
FIG. 5 is a simplified view of an exposure pattern formed on a substrate by three interfering beams.
Figure 6:
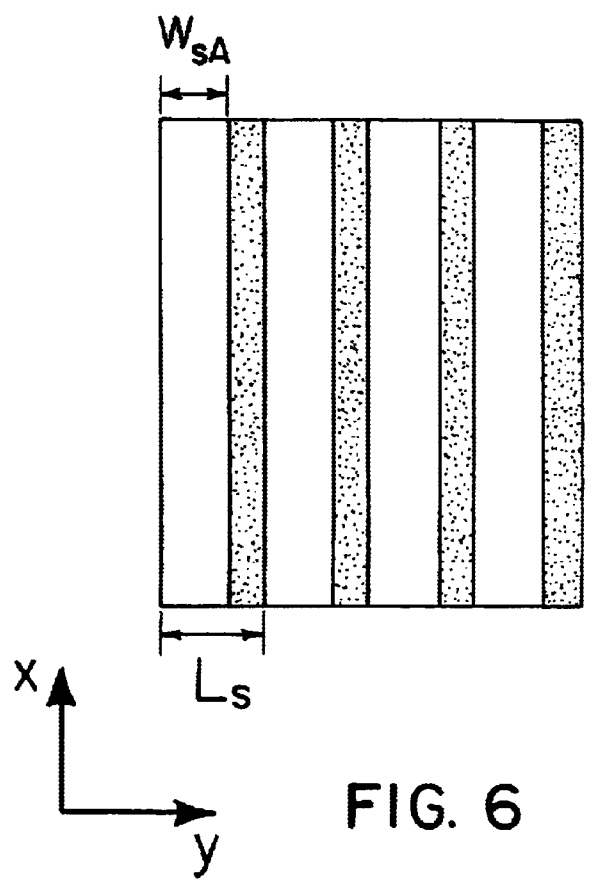
FIG. 6 is a simplified diagram illustrating the stripe pattern of illumination at the surface of a substrate from two interfering beams.

The following discusses the morphology of thin films of asymmetric (cylinder-forming) diblock copolymers on nano-patterned substrates. Monte Carlo simulations were used to avoid the assumptions implicit in theoretical work. If the substrate is patterned with an array, (e.g., a hexagonal array) of regions as shown in FIG. 5 that are preferentially wet by the minority component of the block copolymer, and the period of the surface pattern is commensurate with the period in the imaging layer, then the cylindrical domains in the block copolymer film will orient perpendicular to the substrate and amplify the surface pattern throughout the thickness of the film with long-range order. Perpendicular orientation and long-range order of hexagonally packed cylinders in the film can also occur on striped surfaces of the type as shown in FIG. 6, with appropriate pattern dimensions and strengths of molecular level interactions between the polymer and the substrate over which these desirable configurations are achieved.

To analyze such systems, Monte Carlo simulations were performed in an expanded grand-canonical ensemble in the framework of a cubic lattice. Rectangular simulation boxes of dimensions $L_x$, $L_y$ and $L_z$ were employed. Asymmetric diblock copolymers with chain length N=36 and a volume fraction of the shorter (denoted by A) blocks $f_A = \frac{1}{4}$ are confined between two hard and flat surfaces perpendicular to the z direction. Periodic boundary conditions are applied in the x and y directions. We set the reduced temperature to $T^* = k_B T / \in_{A-B} = 1.5$, where $k_B$ is Boltzmann's constant, T is the absolute temperature, and $\in_{A-B} > 0$ is the repulsive interaction energy between non-bonded nearest-neighbor A-B pairs. We also set the reduced chemical potential to $\mu^* = \mu/(k_B T) = 46$, where $\mu$ is the chemical potential of the system. (The ODT temperature of our system is estimated to be around $T^* = 3.0$ at this chemical potential.) Under these conditions, the asymmetric diblock copolymers form hexagonally packed cylinders in the bulk, with an intercylinder distance $L_0 \approx 16.8$ (in units of lattice spacing). In our model, one lattice unit represents one Kuhn segment of a real polymer chain (which is about 0.5~0.7 nm for flexible polymers such as polystyrene); our system is therefore in the range of molecular weights that are suitable for lithographic processes.

The upper surface is homogenous (denoted by sH). To facilitate the formation of perpendicular cylinders, we introduce a slight preference by the upper surface for the longer (B) blocks, i.e., $\in_{A-sH}/\in_{A-B} = 0.2$ and $\in_{B-sH} = 0$. This energetic preference balances the slight entropic preference for the shorter (A) blocks exhibited by a hard and flat surface.

The lower substrate is chemically nano-patterned. The pattern period is set to $L_s = 14 (\approx \sqrt{3} L_0 / 2)$, and the dark stripes are set to strongly prefer the B blocks (denoted by sB), i.e., $\in_{A-sB}/\in_{A-B} = 2$ and $\in_{B-sB} = 0$. The film thickness is fixed at $D = 28 (\approx \sqrt{3} L_0)$; this distance is commensurate with parallel orientation of cylinders having bulk dimensions if such a morphology occurs. We also set $L_x = 67 (\approx 4 L_0)$. The morphological dependence of the thin films on the width $\omega_{sA}$ and the preference $\alpha_{sA} \equiv (\in_{B-sA} - \in_{A-sA})/\in_{A-B}$ of the light stripes (denoted by sA) were then stacked. When the sA stripes energetically prefer A blocks ($\alpha_{sA} > 0$), we set $\in_{A-sA} = 0$; when they prefer B blocks ($\alpha_{sA} < 0$), we set $\in_{B-sA} = 0$.

Contour plots were made of the two-dimensional order parameter profiles $<\rho_A(x,y) - \rho_B(x,y)>$ and $<\rho_A(y,z) - \rho_B(y,z)>$ for the morphology that arises between a lower stripe-patterned substrate and an upper sH surface; here $\rho_A(x,y)$, for example, is the function of lattice sites occupied by the A segments at a given (x,y) and <> represents the average over the z direction for each collected configuration, and then over all collected configurations (at equilibrium). Such ensemble-averaged profiles are more meaningful and conclusive for characterization of different morphologies than visual inspection of a few snapshots of the system configuration. In this case, we set $\omega_{sA} = 9$, which is commensurate with the diameter of cylinders in the bulk, and set $\alpha_{sA} = -0.2$ (the same preference as the upper sH surface). Perpendicular cylinders are formed throughout the entire film, and are located on the light stripes. Due to the staggered packing of cylinder layers (in the x-z plane), $<\rho_A(x,z) - \rho_B(x,z)>$ only exhibits small variations around -0.35, which is consistent with the average density (fraction of occupied lattice sites) $<\rho> \approx 0.7$ of copolymers in our simulations. (Such a density corresponds to highly concentrated solutions or melts of copolymers.).

For the stripe patterns, there is translational symmetry along the x direction; since there is no preferred location of cylinders along the x direction, the perpendicular cylinders can oscillate along this direction during the course of a simulation run. Each "instantaneous" configuration collected after equilibration shows well-ordered, hexagonally packed perpendicular cylinders. It is anticipated that the "grain" size in this case is larger than that obtained by the use of a homogeneous substrate, i.e., the long-range ordering of perpendicular cylinders can be obtained by the use of a stripe-patterned substrate.

Figure 7:
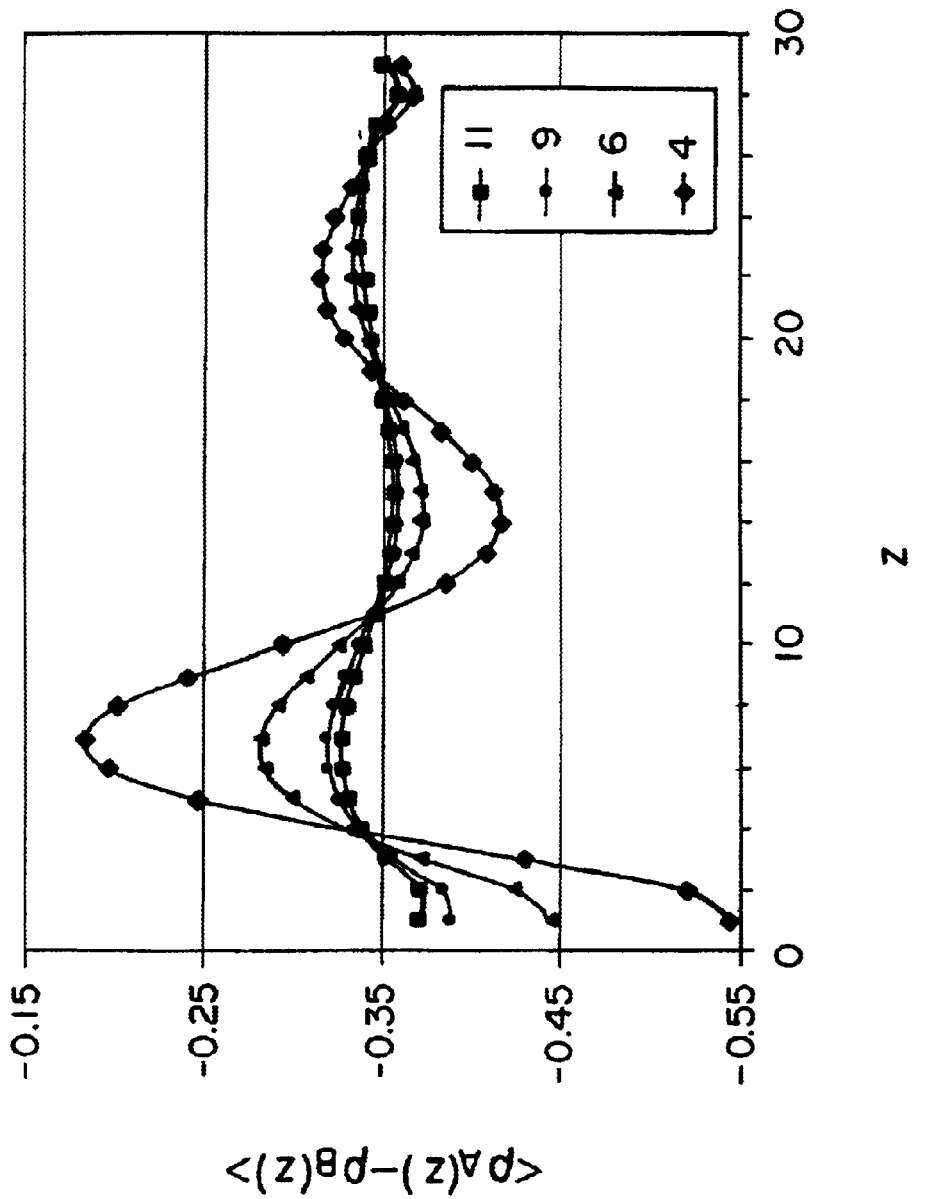
FIG. 7 are plots showing the one-dimensional order parameter profiles for different values of $\omega_{sA}$ with $\alpha_{sA}=-0.2$.
Figure 8:
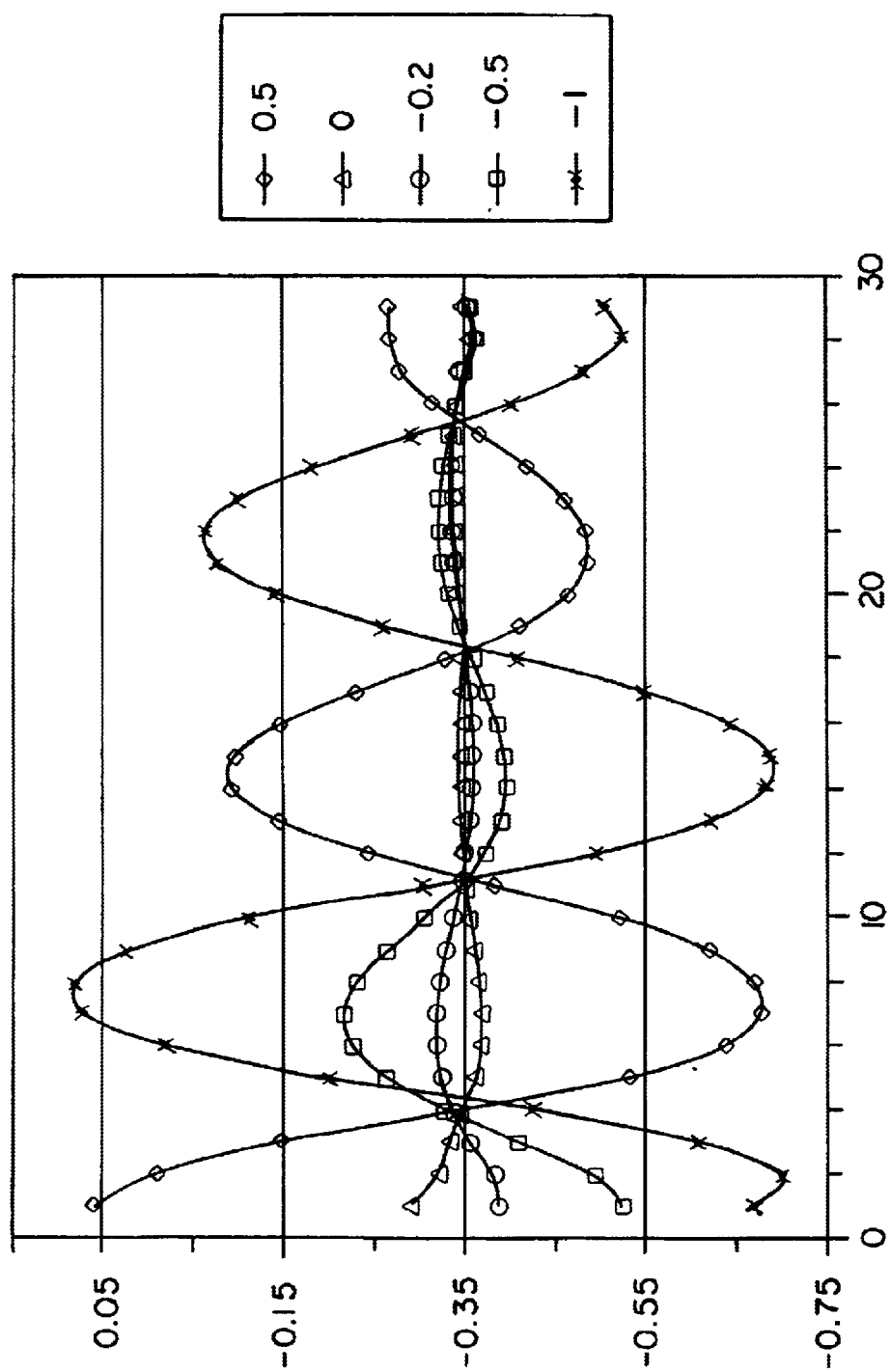
FIG. 8 are graphs illustrating the one-dimensional order parameter profiles for different values of $\alpha_{sA}$ with $\omega_{sA}=9$.

Similar perpendicular cylinders can be obtained within a large range of $\omega_{sA}$, as long as $\alpha_{sA}=-0.2$. FIG. 7 shows the one-dimensional order parameter profiles $<\rho_A(z)-\rho_B(z)>$ for different values of $\omega_{sA}$ with $\alpha_{sA}=-0.2$. the shape of $<\rho_A(z)-\rho_B(z)>$ reflects the undulation of A–B interfaces in the perpendicular cylinders. However, there is only a small "window" of $\alpha_{sA}$ for obtaining such perpendicular cylinders. FIG. 8 shows $<\rho_A(z)-\rho_B(z)>$ for different values of $\alpha_{sA}$ with $\omega_{sA}=9$. A relatively strong preference for the longer (B) blocks ($\alpha_{sA}=-1$) leads to two layers of parallel cylinders. On the other hand, even a weak preference for the shorter (A) blocks ($\alpha_{sA}=0.5$) results in one layer of half-cylinders parallel to the surfaces and registered with the strip-pattern. Contour plots of the two-dimensional order parameter profiles $<\rho_A(x,y)-\rho_B(x,y)>$ and $<\rho_A(y,z)-\rho_B(y,z)>$ for a stronger preference for the A blocks, $\alpha_{sA}=1$, show another layer of parallel cylinders staggered with respect to a layer of half-cylinders. In this case, the intercylinder distance (in the plane parallel to the surfaces) is 14, smaller than $L_0$. Such a frustration may, in addition to the upper sH surface, facilitate the formation of perpendicular cylinders near the upper surface, where bulk dimensions are achieved.

With EUV-IL, a hexagonally patterned substrate, as shown in FIG. 5, can be obtained by double exposure at an angle of 120°, so that the light (sA) regions are regular-hexagonally packed and the rest are sB regions. The sA regions are set to strongly prefer the A blocks, i.e., $\alpha_{sA}=2$. The stripe width is set along the x and y directions to $\omega_{sx}=7$ and $\omega_{sy}=8$, respectively; these values are commensurate with both the dimensions and the hexagonal packing of cylinders in the bulk. The film thickness is again fixed at $D=28(\approx\sqrt{3}L_0)$.

Figure 9:
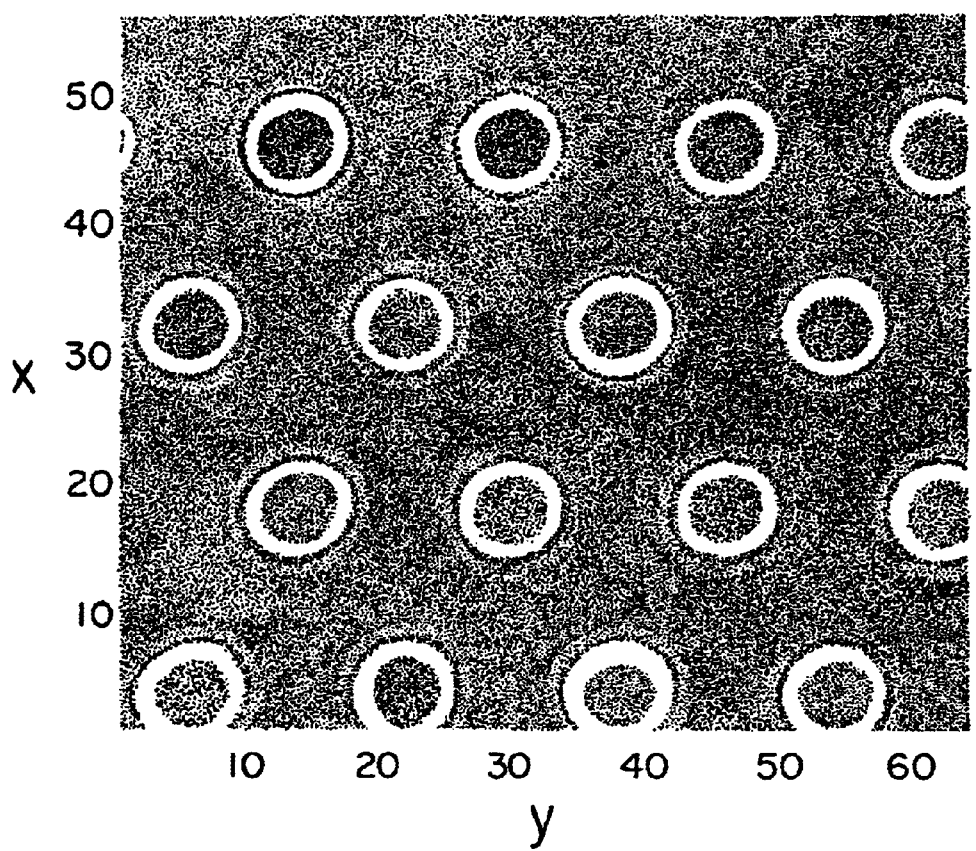
FIG. 9 are contour plots of the two-dimensional order parameter profiles for the morphology between a lower hexagonally patterned substrate and an upper sH surface.

FIG. 9 shows contour plots of the two-dimensional order parameter profiles $<\rho_A(x,y)-\rho_B(x,y)>$ and $<\rho_A(x,z)-\rho_B(x,z)>$ for the morphology between a lower hexagonally patterned substrate and an upper sH surface. It is seen that perpendicular cylinders registered with the substrate pattern form throughout the entire film. The maximum values of $<\rho_A(x,y)-\rho_B(x,y)>$ are about 0.7. The long-range ordering of perpendicular cylinders is successfully induced by the hexagonally patterned substrate. In this case the hexagonal pattern is transposed with respect to those obtained in previous cases, i.e., we have a staggered packing of cylinder layers in the y-z plane. Therefore, $<\rho_A(x,z)-\rho_B(x,z)>$ is similar to the quantity $<\rho_A(y,z)-\rho_B(y,z)>$ and $<\rho_A(y,z)-\rho_B(y,z)>$ now exhibits small variations around −0.35. Although the sA regions are rhombus in this case, the A domains shown in the figure of $<\rho_A(x,y)-\rho_B(x,y)>$ are still circular. This implies that the detailed shape of the sA regions is not crucial; instead, the arrangement of the sA regions is more important. The patterned substrate obtained by intersecting three equally spaced beams of light, i.e., spots of constructive interference in a hexagonal array, would work even better if the spacing between the spots is commensurate with the bulk period.

It is thus seen that both perpendicular and parallel orientations of the cylinders can be obtained by tuning the alternating stripe preference for the two blocks. The long-range ordering of perpendicular cylinders can be induced by a stripe-patterned substrate. An even better ordering can be obtained by employing a hexagonally patterned substrate commensurate with perpendicular cylinders having the same dimensions and packing as in the bulk.

The following are examples for purposes of illustrating the invention. Chemical gratings were patterned on SA films of OTS using EUV-IL with periods from 1400 to 60 nm. The behavior of films of P(S-b-MMA) on these surfaces was studied as a function of the ratio of $L_s$ to $L_0$. For $L_s>L_0$, the surface patterns are transferred into the polymer film resulting in height variations on the surface. For $L_s=L_0$, the surface patterns are amplified by perpendicular lamellae. The two regimes of behavior are discussed in terms of the lamellar structure and orientation in the polymer films.

Materials. Polished 100 mm diameter silicon <100> wafers were purchased from Tygh Silicon and used as substrates for deposition of films. Octadecyltrichlorosilane $(CH_3(CH_2)_{17}SiCl_3, 95\%)$ was purchased from Gelest and was used as received. Toluene (99.8%, anhydrous), and chlorofrom (99+%, anhydrous) were purchased from Aldrich and were used without further purification. Symmetric poly(styrene-block-methyl methacrylate) block copolymers were purchased from Polymer Source Inc. Two molecular weights of P(S-b-MMA) were used in our experiments: (1) number-average molar mass=51 200 g/mol, polydispersity= 1.06, styrene volume fraction=0.48, and $L_0$ is about 30 nm; (2) number-average molar mass=143 500 g/mol, polydispersity=1.09, styrene volume fraction=0.51, and $L_0$ is about 66 nm.

Preparation and Characterization of SA Films of OTS. The silicon wafers were cleaned by immersion in a piranha solution (7:3 (v:v) of 98% $H_2SO_4$/30% $H_2O_2$) at 90° C. for 30 min. The silicon wafers were immediately rinsed with deionized water (resistivity$\geq$18 M$\Omega$/cm) several times and were blown dry with nitrogen. The cleansed substrates were immersed in a 0.1% (v/v) solution of OTS in toluene in a glovebox with a nitrogen atmosphere. The typical immersion times used here ranged from 24 to 30 h. After the substrates were removed from the silane solution, they were rinsed with chloroform for approximately 30 s, and excess chloroform was allowed to evaporate. The films were rinsed with absolute ethanol and were dried under a stream of nitrogen. Advancing contact angles of deionized water on OTS were measured using a Rame'-Hart goniometer, and the typical value was about 105±3°. It has been shown that films of P(S-b-MMA) on the surface of SA films of OTS deposited under identical conditions exhibited symmetric wetting behavior after annealing at 180° C. for 24 h.

Patterning of SA Films of OTS by EUV Interferometric Lithography. OTS was exposed to EUV radiation ($\lambda$=13.4 nm) radiation using the EUV interferometer system at the Center for Nanotechnology in Madison, Wis., discussed further below. The exposures were carried out in a chamber with a pressure of 100 mTorr of oxygen. The intensity of the incident radiation to the surface of SA films was about 10 mW/cm$^2$. The period of the fringe pattern for all exposures was verified by patterning UV6 photoresist (Shipley) after the system was configured with a particular geometry. Metrology of the photoresist was performed using scanning electron microscopy (Hitachi 6180 CD). The line and space structures of photoresist were often not exactly symmetric, as is the latent image (the interference pattern), but the period does not depend on symmetry and could be accurately determined by averaging over a large number of structures.

Deposition of Diblock Copolymer on Patterned OTS. Thin films of P(S-b-MMA) were deposited onto patterned OTS substrates by spin-coating from dilute solutions (2% w/w) of the copolymers in toluene. Films were spun at rates from 2500 to 3000 rpm for 60 s. The initial thicknesses of the films were determined using a Rudolf Research/Auto EL II ellipsometer using a He—Ne laser ($\lambda$=632.8 nm) at an incident angle of 70° relative to the surface normal of the substrates. The use of the ellipsometer to measure the thicknesses of the P(S-b-MMA) films required an assumption about the index of refraction, n, for the microphase-separated material. We assume n was the same as for polystyrene, and the results were consistent with measurements using a profilometer. The polymer films were annealed at 180° C. in a vacuum oven for 24 h. After annealing, the films were investigated using atomic force microscopy (AFM) and transmission electron microscopy (TEM).

The surface topography of the polymer films was characterized using AFM. AFM measurements were performed in air in both contact mode and tapping mode with a Nanoscope III MultiMode system (Digital Instruments). In tapping mode, both topography and phase image were obtained simultaneously. The typical imaging force in contact mode was on the order of $10^{-9}$ N. We used both oxide-sharpened silicon nitride tips (radii=5–40 nm, Digital Instruments) and carbon nanotips (radii<5 nm, Piezomax Technologies, Inc.) to image the topography of the polymer surface.

The internal structure of the films was studied using TEM. TEM was performed on a JEOL 200CX at 200 kV in the bright field mode at the Materials Science Center at the University of Wisconsin-Madison. Samples were imaged in plane-view. A layer of carbon (ca. 20 nm thick) was evaporated onto the surface of films and then covered with a 25% aqueous solution of poly-(acrylic acid) (PAA). After the sample was dried in air overnight, the P(S-b-MMA)-carbon-PAA composite was peeled off the substrate and floated on deionized water with the PAA side down. After the PAA layer dissolved, the floating film was collected onto TEM grids. The films were then exposed to the vapor of the $RuO_4$ solution for 15 min. The $RuO_4$ selectively stains the PS block and provides contrast in electron density.

Figure 10:
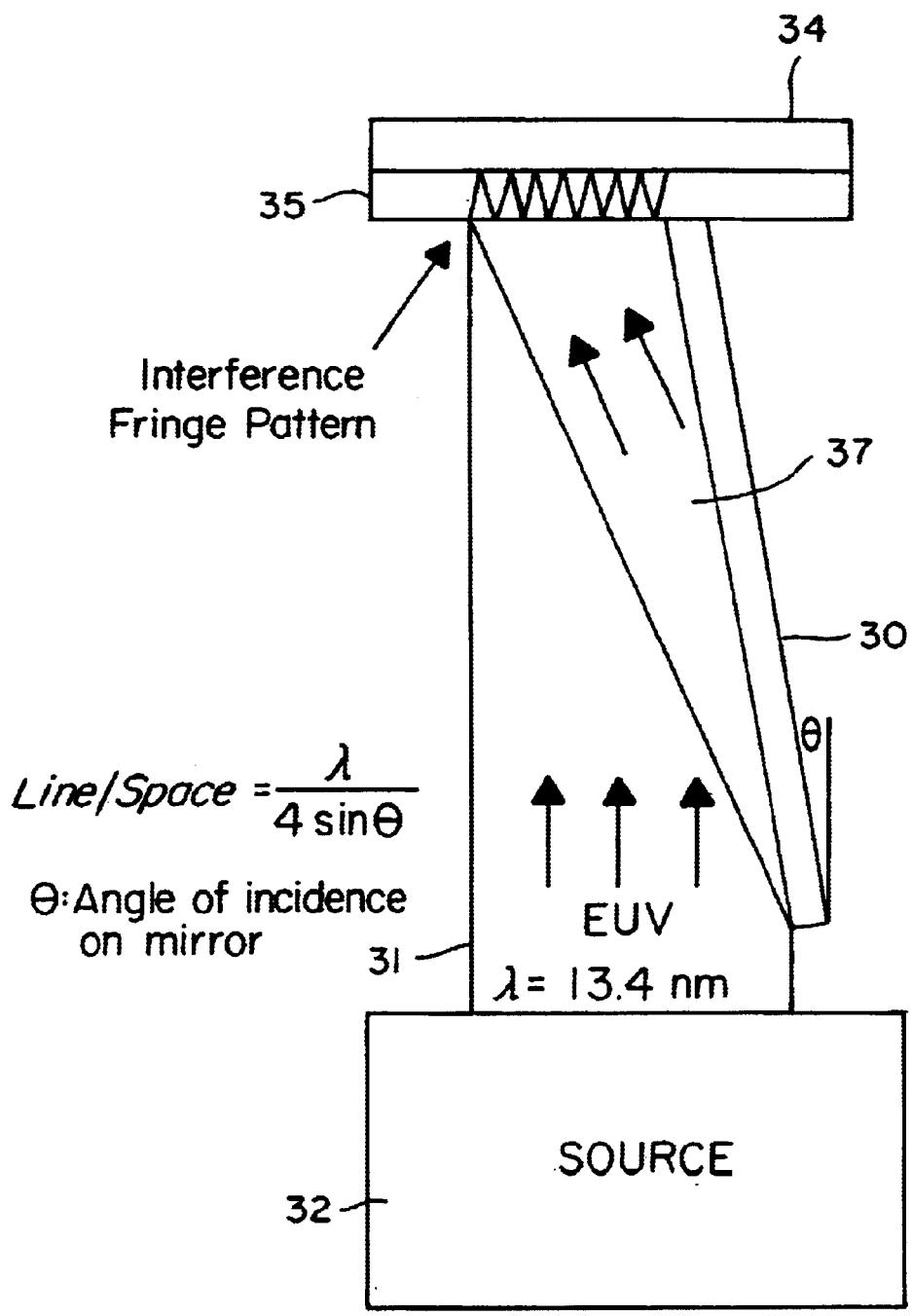
FIG. 10 is a schematic diagram of an interferometric lithography system that may be utilized to expose samples in a pattern in accordance with the invention.

A schematic of the EUV interferometer exposure system utilized for the foregoing example is shown in FIG. 10. An Au-coated polished silicon wafer 30 (prepared by vacuum deposition with a root-mean-square roughness<0.32 nm) was used as a Lloyd's mirror set at an angle θ to the EUV beam 31 from a radiation source 32 (e.g., a synchrotron light source) to reflect part of an incident beam at grazing incidence and interfere with the direct beam at the sample plane. The fringe period is given by $\lambda/(2 \sin \theta)$ where θ is the angle of incidence with the Lloyd's mirror. The theoretical limit is 6.7 nm for the minimum printable period for incident radiation with a wavelength of 13.4 nm. A silicon wafer 34 with an imaging layer 35 of OTS thereon is placed at the downstream end of the mirror 30 so as to irradiate the layer 35 with the directly incident beam 31 from the source and a beam 37 reflected from the mirror 30 which are incident on the imaging layer 35 at an angle to each other to form interference fringe patterns. The number of fringes depends on the spatial and temporal coherence of the source. The spatial coherence depends on the size of the light source and distance from the source. In the experimental setup, temporal coherence ultimately limits the number of fringes, and the source can be considered to be spatially coherent for practical purposes. The finite temporal coherence limits the allowed optical path difference between the direct and reflected beams for producing fringes. The number of fringes, m, is proportional to $\lambda/\Delta\lambda$. The interferometer can be operated with or without a monochromator (not shown) in the path of the beam before the mirror. With the monochromator, the beam intensity is low, but $\lambda/\Delta\lambda$ is approximately 1000. In this mode, approximately 1000 fringes were produced. If the fringe period was 40 nm, for example, the width of the patterned area observed in patterns of photoresist was 40 $\mu$m. Without the monochromator, the number of the fringes produced is 15–20 ($\lambda/\Delta\lambda \approx$15–20), but the intensity of the beam is approximately 60 times greater than that of the monochromatic beam. Because of differences in sensitivity and contrast between photoresist and OTS imaging layers, the number of fringes that were observed in patterned photoresist was significantly greater than the number of fringes that were observed on patterned OTS. Exposures of OTS with grating periods of about 60 nm were performed without the monochromator so as to reduce the exposure times to approximately 50–60 s compared to about 1 h with the monochromator. The length of the exposed area corresponded to the width of the beam, about 5 mm. The 30 nm features on the patterned SA films of OTS with the smallest grating periods are the smallest reported features on SA films of alkylsiloxanes patterned using a parallel patterning technique.

From an AFM image of the surface of a P(S-b-MMA) film after it was deposited and annealed on OTS that had been exposed in the EUV interferometer, the period of the fringe pattern, $L_s$, was found to be 900 nm. The initial film thickness of the block copolymer was 66±2 nm (2.2$L_0$). With knowledge of the initial film thickness and $L_0$, the formation of topography on the surface of the film and the type of topography were used to determine the wetting of the block copolymer at the substrate. For the initial thickness of 2.2$L_0$, island formation was indicative of symmetric wetting, and hole formation was indicative of asymmetric wetting. Three different regions were observed on this sample. The left side of the surface was unexposed because it was in the shadow of the mirror. Islands with heights of about 30 nm ($L_0$) were observed in this region, indicating symmetric wetting of the block copolymer with the PS block at the polymer-substrate interface and at the free surface. The right side of the surface was uniformly exposed because this region is outside the area where coherent fringes are produced. Holes with depths of about 30 nm were observed in the exposed region, indicating asymmetric wetting of the block copolymer. In this case, the PMMA block preferentially wet the polymer-substrate interface, and PS was present at the free surface. On the patterned region in the middle, the topography of the block copolymer film replicated the period of the fringes of the EUV exposure. AFM measurements showed that the pattern period was 900 nm, and the difference in height between adjacent regions was 15 nm.

These results may be interpreted as follows. Exposure of OTS to X-rays results in the incorporation of oxygen-containing functional groups on the surface of the film. Primary and secondary electrons generated by the interaction of the X-rays with the substrate are primarily responsible for the photochemical reactions. The chemical modification of OTS exposed to EUV radiation is expected to follow the same mechanism as that for X-ray exposures. The wetting behavior of P(S-bMMA) films on OTS-covered substrates can be tuned from symmetric to neutral to asymmetric wetting with increasing dose of x-rays. The transitions in wetting behavior were correlated to relative values of interfacial energy for the PS and PMMA blocks on these surfaces. The wetting behavior observed on OTS exposed to EUV radiation follows the same trends: symmetric wetting was observed on unexposed OTS or OTS exposed to low doses, and asymmetric wetting was observed on OTS exposed to high doses. The topography observed in the middle regions is identical to that observed on OTS patterned with X-ray lithography with dimensions of 150–1000 nm. Adjacent exposed and unexposed regions exhibited asymmetric and symmetric wetting, respectively, and the block copolymer film differed in height by 15 nm (½ $L_0$) across adjacent regions. The height difference of ½ $L_0$ corresponded to the difference in quantized thickness between symmetric and asymmetric wetting behavior.

AFM images of the surface of P(S-b-MMA) films after they were annealed on OTS that had been patterned with EUV interferometer with periods of 240 nm and 120 nm showed that the period of the fringe pattern was replicated with great fidelity by the undulating topography of the polymer films. The difference in height between exposed and unexposed regions for both cases was less than 15 nm (½ $L_0$). To investigate the decrease in height difference with decreasing pattern dimensions, we configured the EUV interferometer to produce Fresnel diffraction fringes. The difference in height between adjacent regions, $\Delta h$, decreased from 15 to 3–4 nm, as $L_s$ decreased from about 1410 nm (about 47 $L_0$) to 240 nm (4 $L_0$, $L_0$=30 nm).

As the period of the interference pattern fringes with which the OTS was exposed approached the bulk lamellar period $L_0$ of the block copolymer, a different behavior was observed. An AFM phase image was made of P(S-b-MMA) film after it was annealed on an OTS surface that had been exposed using the EUV interferometer configured to produce about 60 nm fringe periods. The initial film thickness was about 60 nm ($L_0$). AFM images of the topography of the polymer films revealed that surface roughness was on the order of 1 nm, but no pattern in the roughness was observed. In phase images, however, a pattern was observed on the patterned region that matched the fringe period of the exposure. On the nonpatterned unexposed and exposed regions of the samples, there was no evidence of alignment of the features in the phase image.

The foregoing experiment results show that if the period of the striped pattern in wetting behavior on the surface was greater than $L_0$, the lamellae structure of P(S-b-MMA) films was orientated parallel to substrate and exhibited topography that replicated the underlying pattern of the surface. The difference in height between adjacent regions had a maximum value of ½ $L_0$ and decreased as $L_s$ approached $L_0$. If the period of the surface patterns was commensurate with $L_o$, and preferably within 20% of $L_0$, the lamellae structure was oriented perpendicular to the substrate and amplified the pattern of the imaging layer. Guided self-assembly of lamellae in block copolymer films was observed over macroscopic dimensions.

It is understood that the invention is not confined to the embodiments set forth herein as illustrative, but embraces all such forms thereof as come within the scope of the following claims.

What is claimed is:

1. A method of forming copolymer structures, comprising:
   (a) providing a substrate with an imaging layer thereon that will respond to exposure to selected wavelengths to change the wettability of the exposed material of the imaging layer to the components of a selected block copolymer;
   (b) exposing the imaging layer to two or more beams of radiation within the selected wavelengths to form interference patterns having a period of 100 nanometers or less at the imaging layer to change the wettability of the imaging layer in accordance with the interference patterns in the exposed imaging layer;
   (c) depositing a layer of the selected copolymer onto the exposed imaging layer; and
   (d) annealing the copolymer layer on the substrate to separate the components of the copolymer in accordance with the pattern of wettability for the components of the copolymer in the underlying imaging layer to replicate the pattern of the imaging layer in the copolymer layer.

2. The method of claim 1 wherein the beams are at wavelengths in the extreme ultraviolet or shorter and one of the beams is provided directly incident from a source onto the imaging layer and another beam is provided by reflecting a portion of a beam from said source with a Lloyd's mirror onto the imaging layer at an angle to the beam that is directly incident on the imaging layer.

3. The method of claim 2 wherein a third beam is provided to the imaging layer by reflecting a portion of a beam from said source with another Lloyd's mirror onto the imaging layer at an angle to the beam that is directly incident on the imaging layer, the two Lloyd's mirrors positioned at an angle to each other to provide interference patterns at the imaging layer that are at an angle to each other.

4. The method of claim 3 wherein the two Lloyd's mirrors are positioned at a 120° angle to provide an array of separated regions that are preferentially wet by one of the components of the selected block copolymer.

5. The method of claim 2 wherein said source of the beams of radiation is a synchroton.

6. The method of claim 1 wherein the imaging layer is an alkylsiloxane self-assembled monolayer.

7. The method of claim 1 wherein the imaging layer is an octadecyltrichlorosilane self-assembled monolayer.

8. The method of claim 1 wherein the selected block copolymer is a copolymer of polystyrene and poly(methyl methacrylate).

9. The method of claim 1 wherein the thickness of the copolymer layer is equal to or less than the bulk lamellar period $L_0$ of the selected copolymer.

10. A method of forming copolymer structures, comprising:
    (a) providing a substrate with an imaging layer thereon that will respond to exposure to selected wavelengths to change the wettability of the exposed material of the imaging layer to the components of a selected block copolymer;
    (b) exposing the imaging layer to two or more beams of radiation within the selected wavelengths to form interference patterns having a period that substantially equals the bulk lamellar period $L_0$ of the selected copolymer at the imaging layer that define an array of separated regions to change the wettability of the imaging layer in accordance with the interference patterns in the exposed imaging layer;
    (c) depositing a layer of the selected copolymer onto the exposed imaging layer; and
    (d) annealing said selected copolymer layer on the substrate to separate the components of the copolymer in accordance with the pattern of wettability for the components of the copolymer in the underlying imaging layer to replicate the pattern of the imaging layer in the copolymer layer.

11. The method of Claim 10 wherein the imaging layer is exposed to three beams of radiation within the selected wavelengths to form the interference patterns.

12. The method of claim 10 wherein the beams are at wavelengths in the extreme ultraviolet or shorter and one of the beams is provided directly incident from a source onto the imaging layer and two other beams are provided by reflecting portions of a beam from the same source with Lloyd's mirrors onto the imaging layer at angles to the beam that are directly incident on the imaging layer, the two Lloyd's mirrors positioned at an angle to each other to provide interference patterns at the imaging layer that are at an angle to each other.

13. The method of claim 12 wherein the two Lloyd's mirrors are positioned at a 120° angle to provide an array of separated regions that are preferentially wet by one of the components of the selected block polymer.

14. The method of claim 12 wherein the source of the beams of radiation is a synchrotron.

15. The method of claim 10 wherein the imaging layer is an alkylsiloxane self-assembled monolayer.

16. The method of claim 10 wherein the imaging layer is an octadecyltrichlorosilane self-assembled monolayer.

17. The method of claim 10 wherein the selected copolymer is a copolymer of polystyrene and poly(methyl methacrylate).

18. The method of claim 10 wherein the thickness of the copolymer layer is equal to or less than the bulk lamellar period $L_0$ of the selected block copolymer.

19. The method of claim 10 further including removing the component of the selected block copolymer in the annealed copolymer layer that is in the separated regions of the array.

20. The method of claim 19 further including depositing a material in openings left in the copolymer layer.

21. A method of forming copolymer structures, comprising:
  (a) providing a substrate with an imaging layer thereon that will respond to exposure to selected wavelengths to change the wettability of the exposed material of the imaging layer to the components of a selected block copolymer;
  (b) exposing the imaging layer to two or more beams of radiation within the selected wavelengths to form interference patterns at the imaging layer to change the wettability of the imaging layer in accordance with the interference patterns in the exposed imaging layer and such that the interference pattern has a period that is within 20% of the bulk lamellar period $L_0$ of the selected copolymer;
  (c) depositing a layer of the selected copolymer onto the exposed imaging layer; and
  (d) annealing the copolymer layer on the substrate to separate the components of said selected copolymer in accordance with the pattern of wettability for the components of the copolymer in the underlying imaging layer to replicate the pattern of the imaging layer in the copolymer layer.

22. The method of claim 21 wherein the beams are at wavelengths in the extreme ultraviolet or shorter and one of the beams is provided directly incident from a source onto the imaging layer and another beam is provided by reflecting a portion of a beam from the said source with a Lloyd's mirror onto the imaging layer at an angle to the beam that is directly incident on the imaging layer.

23. The method of claim 22 wherein a third beam is provided to the imaging layer by reflecting a portion of a beam from said source with another Lloyd's mirror onto the imaging layer at an angle to the beam that is directly incident on the imaging layer, the two Lloyd's mirrors positioned at an angle to each other to provide interference patterns at the imaging layer that are at an angle to each other.

24. The method of claim 23 wherein the two Lloyd's mirrors are positioned at a 120° angle to provide an gray of separated regions that are preferentially wet by one of the components of the selected block copolymer.

25. The method of claim 22 wherein the source of beams of radiation is a synchroton.

26. The method of claim 21 wherein the imaging layer is an alkylsiloxane self-assembled monolayer.

27. The method of claim 21 wherein the imaging layer is an octadecyltrichlorosilane self-assembled monolayer.

28. The method of claim 21 wherein the selected block copolymer is a copolymer of polystyrene and poly(methyl methacrylate).

29. The method of claim 21 wherein the interference pattern in the imaging layer has a period of 100 nm or less.

30. The method of claim 21 wherein the thickness of the copolymer layer is equal to or less than the bulk lamellar period $L_0$ of the selected block copolymer.

* * * * *

UNITED STATES PATENT AND TRADEMARK OFFICE
CERTIFICATE OF CORRECTION

PATENT NO. : 6,746,825 B2
DATED : June 8, 2004
INVENTOR(S) : Paul F. Nealey et al.

It is certified that error appears in the above-identified patent and that said Letters Patent is hereby corrected as shown below:

<u>Column 12,</u>
Line 64, delete "P(S-bMMA)" and replace it with -- P(S-b-MMA) --.

<u>Column 15,</u>
Line 8, delete the words "the same" in the phrase "from the same source" and replace them with the word -- said -- to read -- from said source --.

<u>Column 16,</u>
Line 28, delete the words "an gray" and replace them with -- an array --.

Signed and Sealed this

Seventh Day of December, 2004

JON W. DUDAS
*Director of the United States Patent and Trademark Office*